United States Patent [19]

Chauvin

[11] Patent Number: 4,743,865

[45] Date of Patent: May 10, 1988

[54] QUARTZ-CRYSTAL MICROWAVE OSCILLATOR OF THE COMMON-EMITTER TRANSMISSION TYPE WITH TWO TRANSISTORS AND A PREDETERMINED LOADED Q FACTOR

[75] Inventor: Jacques Chauvin, Pontarlier, France

[73] Assignee: Compagnie d'Electronique et de Piezoelectricite Cepe, Argenteuil, France

[21] Appl. No.: 71,466

[22] Filed: Jul. 9, 1987

[30] Foreign Application Priority Data

Jul. 9, 1986 [FR] France ............... 86 09975

[51] Int. Cl.[4] .............................. H03B 5/36
[52] U.S. Cl. ................... 331/116 R; 331/158; 331/159; 331/177 R; 331/177 V
[58] Field of Search ............ 331/116 R, 116 FE, 158, 331/159, 177 R, 177 V

[56] References Cited

U.S. PATENT DOCUMENTS 4,139,826  2/1979  Pradal ............... 331/116 R
4,540,956  9/1985  Chauvin et al. ............... 331/116 R

FOREIGN PATENT DOCUMENTS 0139583  5/1985  European Pat. Off. .
1144459  3/1969  United Kingdom .

OTHER PUBLICATIONS

Microwave Journal, vol. 25, No. 2, Fevrier 1982, pp. 91–93, Dedham, Mass., US; S. Neylon: "Hybrid Saw Oscillators".

Primary Examiner—Eugene R. Laroche
Assistant Examiner—David Mis
Attorney, Agent, or Firm—Oblon, Fisher, Spivak, McClelland & Maier

[57] ABSTRACT

The resonant frequency of a quartz-crystal microwave oscillator is the fundamental frequency in the partial mode of the crystal and makes it possible to maintain the loaded Q of the resonator at a high value. This microwave oscillator is provided with two amplifying stages and has a signal-to-noise ratio of the order of 160 dB.

10 Claims, 4 Drawing Sheets

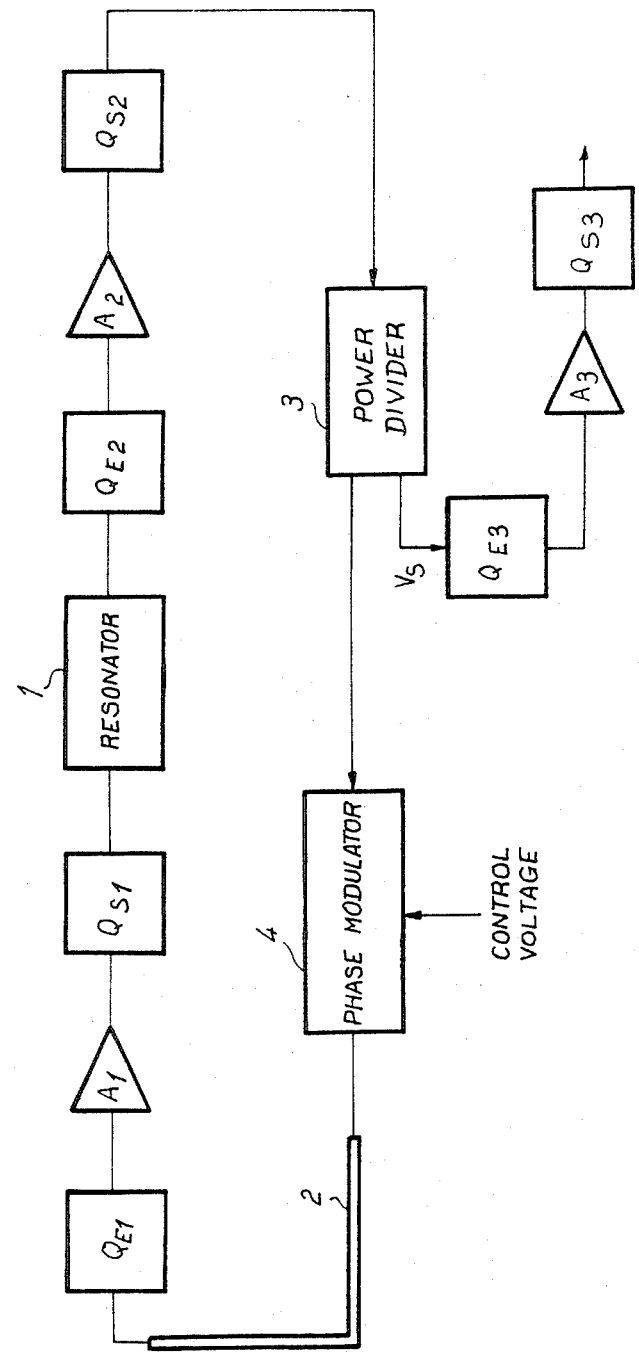
FIG_1

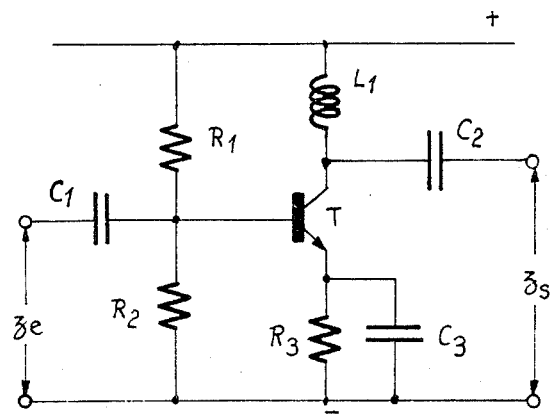
FIG_2
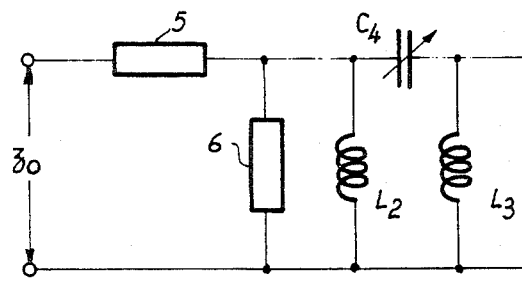
FIG_3
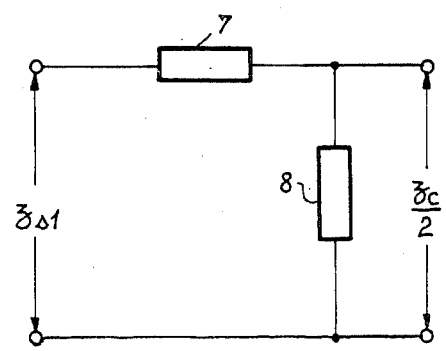
FIG_4
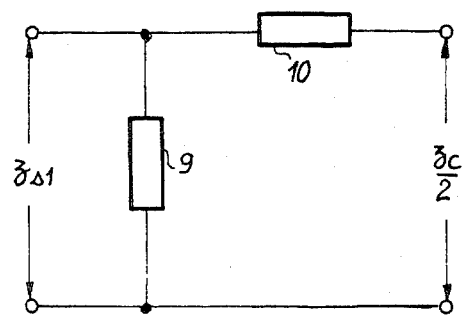
FIG_5

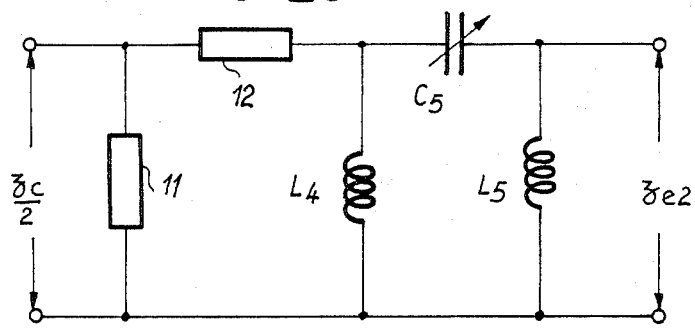
FIG_6
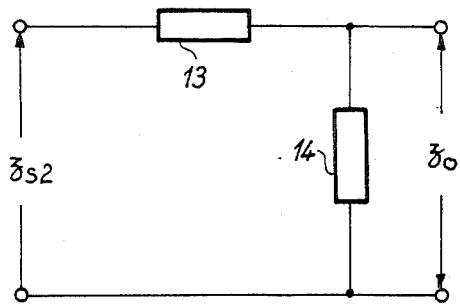
FIG_7
FIG_8
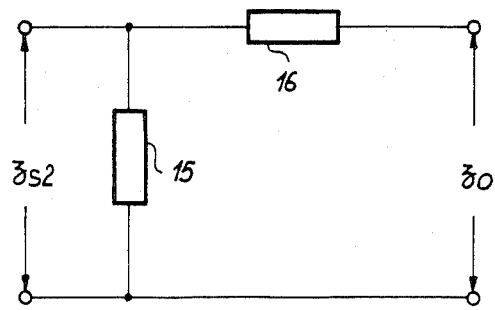
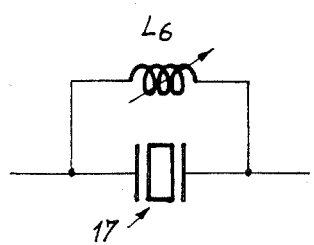
FIG_9

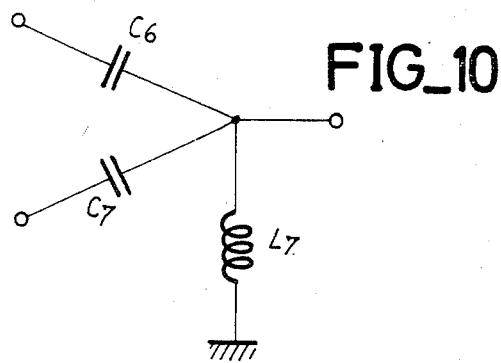
FIG_10
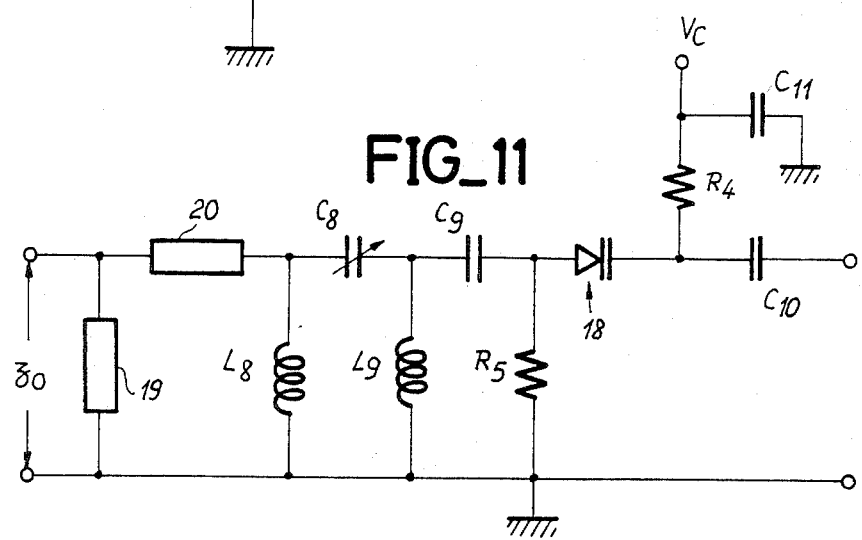
FIG_11
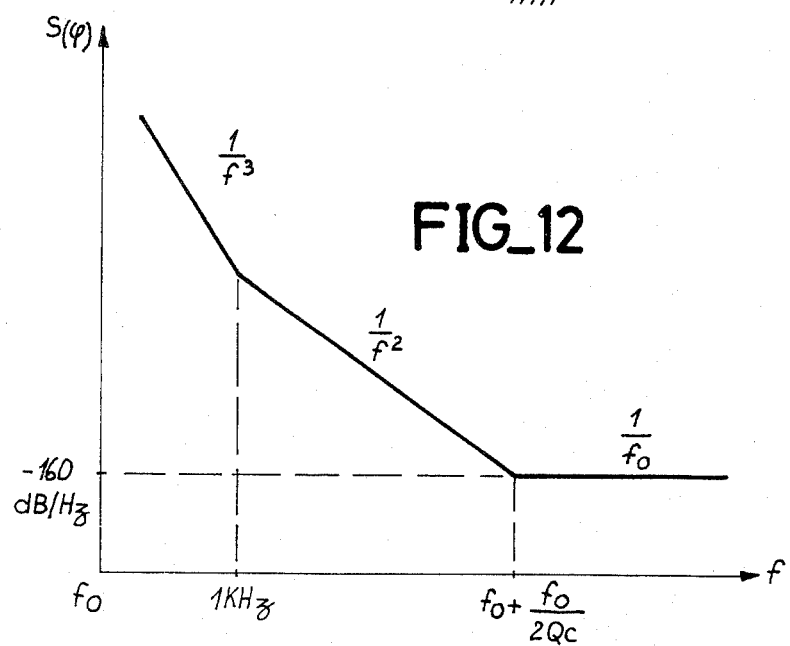
FIG_12

QUARTZ-CRYSTAL MICROWAVE OSCILLATOR OF THE COMMON-EMITTER TRANSMISSION TYPE WITH TWO TRANSISTORS AND A PREDETERMINED LOADED Q FACTOR

BACKGROUND OF THE INVENTION

1. Field of the Invention

The present invention relates to a quarter-crystal oscillator for very high frequencies, typically within the range of 750 MHz to 1.5 GHz.

2. Description of the Prior Art

Quartz-crystal oscillators which operate at very high frequencies of the order of one gigahertz are already known. These very high frequencies are obtained by multiplication of the resonant frequency of the crystal. An operation of this type, however, always results in degradation of the signal-to-noise ratio of the oscillator. The degradation expressed in decibels is equal to 20 log n if n is the multiplication rank.

SUMMARY OF THE INVENTION

In order to overcome the disadvantages outlined in the foregoing, the present invention proposes a quartz-crystal oscillator in which the resonant frequency is the fundamental frequency in the partial mode of the quartz crystal and which make it possible to maintain the loaded Q or quality factor of the resonator at a high value. This oscillator is constructed by means of two transistors and is characterized by a very high signal-to-noise ratio of the order of 160 dB.

An object of the invention is to provide a quartz-crystal microwave oscillator which is capable of operating at frequencies within the range of 750 to 1500 MHz and the feedback loop of which satisfies the Barkhausen conditions, this oscillator being distinguished by the following features:

the feedback loop includes at least the following elements placed in series and in this order: a first matching quadripole, a first amplifying stage, a second matching quadripole, a resonator, a third matching quadripole, a second amplifying stage, a fourth matching quadripole and a power divider;

the amplifying stages each have one transistor mounted with a common emitter connection;

the matching quadripoles makes it possible to match the input and output impedances of the amplifying stages with the other elements of the feedback loop;

the resonator is constituted mainly by a quartz crystal;

the power divider serves to collect the output signal of the oscillator for onward transmission to a utilization circuit.

BRIEF DESCRIPTION OF THE DRAWINGS

FIG. 1 is a block diagram of the oscillator in accordance with the invention.

FIG. 2 is an electrical diagram of an amplifying stage having one transistor mounted with a common-emitter connection.

FIGS. 3 to 8 are electrical diagrams of impedance-matching quadripoles.

FIG. 9 illustrates a quartz crystal equipped with its balancing inductor.

FIG. 10 illustrates a power divider.

FIG. 11 is an electrical diagram of a voltage-controlled phase modulator.

FIG. 12 is a diagram representing the phase-noise characteristic of the oscillator.

DESCRIPTION OF THE PREFERRED EMBODIMENTS

The oscillator in accordance with the invention has the structure shown in FIG. 1. This functional diagram comprises two amplifiers $A_1$ and $A_2$, four matching quadripoles $Q_{E1}$, $Q_{S1}$, $Q_{E2}$ and $Q_{S2}$, a resonator 1, a matched length of line 2 for satisfying the phase condition of the oscillator, a power divider 3 for collecting the output signal $V_s$ and possibly a voltage-controlled phase modulator 4 in the event that frequency tuning is necessary.

The oscillator in accordance with the invention must satisfy the Barkhausen conditions (gain equal to 1 and phase difference equal to $2 k\pi$).

The quartz crystal employed can be of the surface-wave type or of the volume-wave type in which a given resonant frequency is chosen as the oscillator frequency. Said quartz crystal is compensated or balanced at said frequency by a parallel circuit which includes at least one inductor. This parallel circuit permits suppression of the parasitic capacitance which is present between the circuit electrodes. As stated earlier, it is important to maintain the loaded quality factor $Q_c$ of the resonator at a high value. This last-mentioned point directly governs the spectral quality of the pilot $f_0/2Q_c$ and consequently the stability in time. The quality factor of the quartz crystal depends on the load impedances which are present at its terminals. If R is the intrinsic resistance of the resonator, $R_c$ is the load resistance and $Q_v$ is the unloaded quality factor of the crystal, we have:

$$\frac{Q_c}{Q_v} = \frac{R}{R + R_c}$$

In order to ensure that the quality factor $Q_c$ is as high as possible, it is important to reduce the load resistance $R_c$. Reduction of $R_c$ is limited by the insertion loss $P_I$ sustained by the resonator with this value of load impedance, namely in decibels:

$$P_I = 20 \log \frac{\frac{R_c}{2}}{R + \frac{R_c}{2}}$$

For example, if $R = 100 \ \Omega$ and $R_c = 100 \ \Omega$ (namely a characteristic impedance of 50 $\Omega$), the insertion loss is 9.5 dB and the ratio $Q_c/Q_v$ has a value of 0.5. It is therefore apparent that, in order to maintain a loaded quality factor having a value of one-half the unloaded quality factor, the insertion loss is already 9.5 dB and has to be counterbalanced by the gain of the amplifier. If it is considered that the amplifying portion compensates for the insertion loss of the crystal, the insertion loss of the power divider, and that it provides the useful gain margin $\epsilon$ (in dB) for turn-on of the oscillator, the minimum gain of this amplifying portion must be approximately 14 dB in the case of the numerical example given above (namely 9.5 dB in respect of the insertion loss of the resonator + approximately 3 dB in respect of the power divider + approximately 2 dB in respect of the gain margin).

When using a low-cost oscillator having a single transistor, it is difficult to obtain a gain of this order at a frequency of 1 GHz. The oscillator in accordance with the invention makes use of two transistors for satisfying the gain condition. Accordingly, if consideration is again given to the numerical application mentioned earlier by way of example and postulating a unitary gain of 12 dB per amplifying stage (which is a reasonable assumption), there will remain about 19 dB for compensating the insertion loss of the crystal (gain of 24 dB less 3 dB for the power divider less 2 dB for the gain margin). Under these conditions, from the formula which relates $P_I$ to the impedances R and $R_c$, we obtain $R_c/2 = 0.126 R$. Thus, if $R = 100 \Omega$, we have $R_c/2 = 12.6 \Omega$ and $Q_c/Q_v = 0.88$. In consequence, two transistors make it possible to attain a loaded Q factor of the quartz crystal which is very close to the unloaded Q factor and to operate at low load impedances (approximately 0.12 R).

It is for these reasons that the oscillator in accordance with the invention has two amplifying stages $A_1$ and $A_2$. Each amplifier can be constituted by a transistor mounted with a common-emitter connection. Since this transistor connection has the property of reversing the phase of the signal, the phase condition ($2k\pi$) is satisfied. The electrical diagram of FIG. 2 illustrates a possible type of circuit assembly for these amplifiers. This circuit assembly comprises a transistor T, resistors $R_1$ and $R_2$ forming a bias resistor bridge, an emitter resistor $R_3$ decoupled by a capacitor $C_3$, a choke coil $L_1$ and coupling capacitors $C_1$ and $C_2$. The circuit assembly has an input impedance designated as $z_e$ and an output impedance designated as $z_s$.

The quadripoles $Q_{E1}$ and $Q_{S1}$ are the matching quadripoles of the amplifier $A_1$, respectively for its input and its output. Since the standardized impedance is $z_o$, the quadripole $Q_{E1}$ makes it possible to change-over from the impedance $z_o$ to the impedance $z_{e1}$ (input impedance of the amplifier $A_1$) and to remove the low-frequency gain by incorporating a high-pass filter. As illustrated in the electrical diagram of FIG. 3, a quadripole of this type is formed by two reactive elements 5 and 6 and by a high-pass filter constituted, for example, by the inductors $L_2$ and $L_3$ and by the capacitor $C_4$, the value of which can be adjusted. The quadripole $Q_{S1}$ permits changeover from the impedance $z_{s1}$ (output impedance of the amplifier $A_1$) to the load impedance $z_c/2$. FIGS. 4 and 5 are possible electrical diagrams for this quadripole. The elements 7, 8, 9 and 10 are reactive elements.

The quadripoles $Q_{E2}$ and $Q_{S2}$ are the matching quadripoles of the amplifier $A_2$ respectively for its input and its output. The quadripole $Q_{E2}$ serves to change-over from the load impedance $z_c/2$ to the impedance $z_{e2}$ (input impedance of the amplifier $A_2$) and to eliminate the low-frequency gain by incorporating a high-pass filter. As illustrated in the electrical diagram of FIG. 6, a quadripole of this type is formed by two reactive elements 11 and 12 and by a high-pass filter constituted for example by the inductors $L_4$ and $L_5$ and by the capacitor $C_5$, the value of which can be adjusted. The quadripole $Q_{S2}$ permits changeover from the impedance $z_{s2}$ (output impedance of the amplifier $A_2$) to the impedance $z_o$. FIGS. 7 and 8 are possible electrical diagrams for this quadripole. The elements 13, 14, 15 and 16 are reactive elements.

The microwave crystal constituting the resonator is preferably mounted with a circuit in parallel comprising at least one inductor as shown in FIG. 9. The inductor $L_6$ is so adjusted as to form a rejector circuit with the parasitic capacitance of the crystal 17 at the operating frequency. The shunt effect of this parasitic capacitance is thus eliminated. This circuit arrangement is specific to volume-wave quartz crystals whereas surface-wave crystals do not exhibit this parasitic capacitance.

The power divider can be constructed of discrete components in accordance with the so-called Wilkinson technique and may be either symmetrical or asymmetrical. One example of construction as shown in FIG. 10 comprises the inductor $L_7$ and the two capacitors $C_6$ and $C_7$. By means of this arrangement, a signal $V_s$ is collected from the feedback loop and employed in an output stage, for example. The input and the outputs of the divider are matched with the impedance $z_o$. Said output stage can include an amplifier $A_3$ preceded by a quadripole $Q_{E3}$ for matching the output impedance of the power divider 3 and followed by a quadripole $Q_{S3}$ for matching the output impedance of said amplifier with the characteristic impedance $z_o$.

The function of the phase modulator is to produce a phase shift within the feedback loop as a function of a control voltage, any variation in phase being accompanied by a variation in frequency related to the loaded Q factor of the quartz crystal. The phase variation must be sufficient to obtain the desired frequency deviation but relatively small in order to ensure that the conditions of oscillation are not adversely affected. A phase variation of 30° is a good order of magnitude.

FIG. 11 is an electrical diagram of a phase modulator which is particularly well suited to the invention. This phase modulator is essentially constituted by a varactor 18 matched with the operating frequency as well as a high-pass filter constituted, for example, by the inductors $L_8$ and $L_9$ and by the adjustable capacitor $C_8$. Said high-pass filter facilitates impedance matching. The reactive elements 19 and 20 serve to match this end of the impedance modulator $z_o$. Biasing of the varactor 18 is carried out by the resistors $R_4$ and $R_5$. The capacitors $C_9$ and $C_{10}$ are coupling capacitors. The capacitor $C_{11}$ is a decoupling capacitor. The phase modulator is connected through the capacitor $C_{10}$ to the matched line designated in FIG. 1 by the reference 2.

The length of the characteristic impedance line $z_o$ is such that the phase condition is satisfied within the feedback loop. If $\lambda m$ is the wavelength in a line of this type at the frequency considered, a line length L will introduce a phase shift expressed in degrees equal to $(L \times 360)/\lambda m$. Should the phase shift prove unnecessary, the phase line may accordingly be dispensed with.

The phase modulator and the phase line can be placed at any point of the loop circuit on condition that the impedance matchings are complied with. In the event that the frequency is intended to be fixed, the phase modulator may in that case be suppressed.

FIG. 12 is a diagram illustrating a numerical application of the oscillator in accordance with the invention. This diagram represents the phase noise characteristic $S(\psi)$ expressed in decibels per hertz as a function of the Fourier frequency f in a logarithmic scale. The spectrum is given in respect of a center frequency $f_o$ of 1 GHz. Since the crystal resonator has an unloaded quality factor of 40,000 and a resistance of 250 $\Omega$, the load impedance $z_c/2$ will be 31.5 $\Omega$ and the loaded quality factor $Q_c$ will be approximately 35,500 in accordance with the formulae given earlier. The phase spectrum has a $1/f^3$ slope which is characteristic of the flicker noise, a $1/f^2$ slope which is characteristic of the resonator and is within a frequency range of approximately $f_o+1$ KHz to $f_o+14$ kHz, and a horizontal line at $-160$ dB/Hz which is characteristic of the background noise of the oscillator.

The spectral quality of the oscillator in accordance with the invention is outstanding. This oscillator is particularly well-suited to the field of metrology since the applications in this field call for local oscillators having low noise in a frequency band ranging from 750 MHz to 1.5 GHz. Said oscillator makes it possible to avoid frequency multiplications which have a detrimental effect on the noise level. It also permits a saving of power as well as a reduction in bulk.

These oscillators are of primary interest for such fields of application as telecommunications, radar systems and measuring benches.

What is claimed is:

1. A quartz-crystal microwave oscillator which is capable of operating at frequencies within the range of 750 to 1500 MHz and the feedback loop of which satisfies the Barkhausen conditions, wherein:
   the feedback loop includes at least the following elements placed in series and in this order: a first matching quadripole, a first amplifying stage, a second matching quadripole, a resonator, a third matching quadripole, a second amplifying stage, a fourth matching quadripole and a power divider;
   the amplifying stages each have one transistor mounted with a common emitter connection;
   the matching quadripoles make it possible to match the input and output impedances of the amplifying stage with the other elements of the feedback loop;
   the resonator is constituted mainly by a quartz crystal;
   the power divider serves to collect the output signal of the oscillator for onward transmission to a utilization circuit.

2. An oscillator according to claim 1, wherein the first matching quadripole includes a high-pass filter.

3. An oscillator according to claim 1, wherein the third matching quadripole includes a high-pass filter.

4. An oscillator according to claim 1, wherein the parasitic capacitance of the quartz crystal is compensated at the operating frequency by a circuit which includes at least one inductance coil.

5. An oscillator according to claim 1, wherein the power divider is of the Wilkinson type.

6. An oscillator according to claim 1, wherein the feedback loop also includes a phase line having a length so determined as to satisfy the phase condition.

7. An oscillator according to claim 1, wherein the feedback loop includes a voltage-controlled phase modulator.

8. An oscillator according to claim 7, wherein the phae modulation is obtained by means of a varactor which is subjected to the control voltage.

9. An oscillator according to claim 2, wherein the third matching quadripole includes a high-pass filter, the parasitic capacitance of the quartz crystal is compensated at the operating frequency by a circuit which includes at least one inductance coil, the power divider is of the Wilkinson type, and the feedback loop also includes a phase line having a length so determined as to satisfy the phase condition.

10. An oscillator according to claim 9, wherein the feedback loop includes in addition a phase modulator which is voltage-controlled by means of a varactor.

* * * * *